United States Patent [19]

Nakakita

[11] Patent Number: 4,569,876
[45] Date of Patent: Feb. 11, 1986

[54] MULTI-LAYERED SUBSTRATE HAVING A FINE WIRING STRUCTURE FOR LSI OR VLSI CIRCUITS

[75] Inventor: Shoji Nakakita, Tokyo, Japan
[73] Assignee: NEC Corporation, Tokyo, Japan
[21] Appl. No.: 638,667
[22] Filed: Aug. 8, 1984
[51] Int. Cl.$^4$ .................. B32B 3/10; B32B 15/08
[52] U.S. Cl. ........................... 428/131; 427/86; 427/89; 427/97; 428/132; 428/133; 428/458; 428/901
[58] Field of Search .............. 428/131, 132, 133, 901, 428/458; 427/86, 89, 97

[56] References Cited

U.S. PATENT DOCUMENTS 4,360,570  11/1982  Andreades et al. ............ 428/131 X
4,381,327   4/1983  Briere ........................... 428/131 X

OTHER PUBLICATIONS

"MCP via Configurations", IBM Technical Disclosure Bulletin, vol. 24, No. 5, (Oct. 1981), pp. 2575–2576, O. R. Abolitia, G. V. Elmore and J. Funari.
"Controlled Diffusion Bonding in Multilevel Package", IBM Technical Disclosure Bulletin, vol. 24, No. 12, (May 1982), pp. 6364–6365, D. Clocher, J. Gow, III and H. S. Hoffman.
"High Reliability Metallurgical Structure for Multilevel Substrate Wiring", IBM Technical Disclosure Bulletin, vol. 24, No. 12 (May 1982), p. 6370, W. B. Archey, K. L. Elias and W. J. Slattery.

*Primary Examiner*—Thomas J. Herbert
*Attorney, Agent, or Firm*—Burns, Doane, Swecker & Mathis

[57] ABSTRACT

Good electrical connection between adjacent metal layers in a multi-layered substrate is provided by embedding a conductive material in via-holes in the insulator which separates the adjacent metal layers. This conductive material can be a low temperature sintered metal such as gold, or a conductive organic paste. The presence of the conductive material avoids problems associated with photoresist material that adheres to the side walls of the via-holes during the metallization process.

8 Claims, 9 Drawing Figures

MULTI-LAYERED SUBSTRATE HAVING A FINE WIRING STRUCTURE FOR LSI OR VLSI CIRCUITS

BACKGROUND OF THE INVENTION

This invention relates to a multi-layered substrate having a fine wiring structure used in data processing and communication systems and, more particularly, relates to a large or very large scale integration (LSI or VLSI) circuit multi-layered substrate.

An LSI multi-layered substrate allows high speed computers to be constructed with high density using gold or copper with a sufficiently low electric resistance as conductive materials. As an insulating material between wiring layers of the multi-layered substrate, polyimide group resins are used to achieve a high insulation and a low dielectric constant. For the details of the polyimide insulating layer, reference can be made to the paper by O. R. Abolafia et al entitled "MCP VIA CONFIGURATIONS" in the IBM Technical Disclosure Bulletin, Vol. 24, No. 5 (October 1981), pp. 2575–2576; the paper by D. Clocher et al entitled "CONTROLLED DIFFUSION BONDING IN MULTILEVEL PACKAGE" in IBM Technical Disclosure Bulletin, Vol. 24, No. 12 (May 1982), pp. 6364–6365; and the paper by W. B. Archey et al entitled "HIGH RELIABILITY METALLURGICAL STRUCTURE FOR MULTILEVEL SUBSTRATE WIRING" in IBM Technical Disclosure Bulletin, Vol. 24, No. 12 (May 1982), p. 6370. The polyimide insulating layers proposed by these articles have holes (hereinafter referred to as via-holes) for interconnecting conductive metallization planes separated by each insulating layer. Although these via-holes are tapered, it is practically quite difficult to shape the via-hole in taper form. Therefore, via-holes usually have vertical walls or are reverse-tapered. In the latter case, it becomes difficult to achieve a good adhesion of the thin metallic layer by sputtering on the side wall of the insulating layer in the step of forming a conductive layer on the polyimide insulating layer. A photoresist remains in the via-holes in the steps of photoresist coating, exposure, and developing. This causes difficulties in the formation of the via and an electrical cut-off between the top conductive layer and the via. Therefore, the conventional multi-layered substrates have a disadvantage in that the circuit connection is found unsatisfactory in the conductivity tests that are conducted after the substrate formation.

On the other hand, high temperature baking of about 900° C. (degrees centigrade) becomes necessary when a gold paste is used for the multi-layered substrate with the result that the polyimide insulating layer is consequently deteriorated.

SUMMARY OF THE INVENTION

One object of the present invention is, therefore to provide a multi-layered substrate capable of achieving a precise electric connection between conductive layers and free from the above-mentioned disadvantages.

According to one aspect of the present invention, there is provided a substrate, which comprises:

an insulated substrate; a first metallic conductive layer formed on the insulated substrate; an organic insulating layer having via-holes to form a via closely adhered to the first metallic conductive layer; a low temperature sintered metal embedded in the via-holes of the organic insulating layer; and a second metallic conductive layer formed on the organic insulating layer and the low temperature sintered metal.

According to another aspect of the present invention, there is provided a substrate, which comprises;

an insulated substrate; a first-metallic conductive layer formed on the insulated substrate; an organic insulating layer having via-holes for forming a via closely adhered to the first metallic conductive layer; a conductive organic paste embedded in the via-holes of the organic insulating layer; and a second metallic conductive layer formed on the organic insulating layer and the low temperature sintered metal.

The foregoing and other features and advantages of this invention will be apparent from the following more particular description of the preferred embodiments of the invention as illustrated in the accompanying drawings.

DESCRIPTION OF THE ILLUSTRATED PRIOR ART

Figure 1:
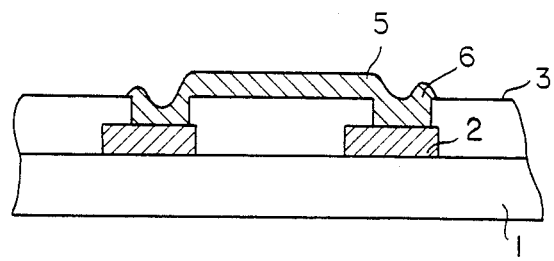
FIG. 1 shows a conventional substrate.

In the drawings, the same reference numerals denote the same structural elements.

Referring to FIG. 1, a substrate having a conventional fine wiring configuration comprises a ceramic insulated substrate 1, a first metallic conductive layer 2 formed on the substrate, a polyimide insulating layer 3 having via holes 6 and layered in such a way as to cover the substrate 1 and the layer 2, and a second metallic conductive layer 5 formed on the layers 3 and 2. It is difficult to cause the layer 5 to adhere closely onto the side wall of the insulating layer 3 by sputtering in the process of forming the layer 5 of such a configuration. In the steps of photoresist coating, exposure and developing, the photoresist remains in the via-holes 6. As a result, the via formation becomes difficult, and electrical cut-offs between the layer 5 and the via in the via holes occur.

Description of Preferred Embodiments

Figure 2:
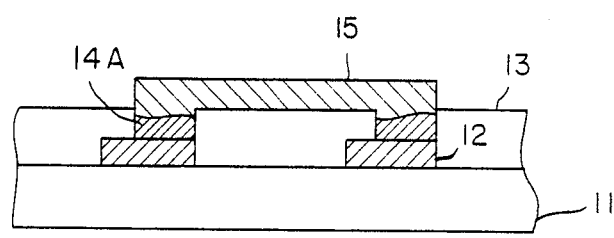
FIG. 2 shows a first embodiment of the present invention.

Referring to FIG. 2, a first embodiment of the invention comprises a ceramic substrate 11 consisting of 97% alumina, a first conductive layer 12 formed on the substrate 11. The conductive layer 12 comprises a lower layer which consists of titanium, chromium, tungsten, or palladium and an upper layer which consists of gold. A polyimide insulating layer 13 with a thickness of 30 microns is formed on the layer 12 and has via-holes in the necessary portion. A low temperature sintered gold 14A is embedded in the via-holes, and a second conductive layer 15 is formed over the gold 14A and the layer 13. This second conductive layer has a lower layer which consists of titanium, chromium, tungsten, or palladium and an upper layer which consists of gold. Use of polyimide resin for the insulating layer 13 achieves the improvement in signal propagation speed because of a low dielectric constant as well as the facilitation of micro-pattern processing because of the smoothness of the insulating surface.

Formation of the low temperature-sintered gold 14A is illustrated by the following two examples. In the first example, a low temperature-sintered gold paste consisting of gold powder and inorganic pulverized glass to be sintered at 400° C. is embedded in the via holes for printing and sintering. In the second example, superfine powder (1000 Å) of gold is directly placed in the via holes and sintered at 400° C.

Figure 3:
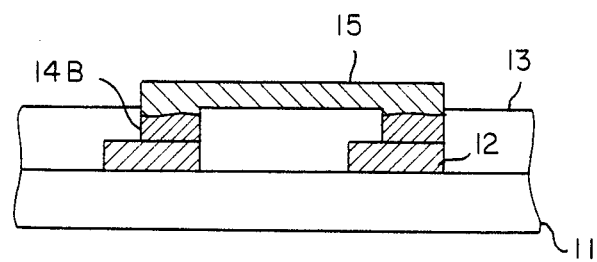
FIG. 3 shows a second embodiment of the present invention.

Referring to FIG. 3, the structural elements of the second embodiment, which are identical to those of the first embodiment, are the ceramic substrate 11, the first conductive layer 12, the polyimide insulating layer 13, and the second conductive layer 15. The second embodiment, however, uses a conductive organic paste 14B, instead of the low temperature sintered gold 14A of the first embodiment. The conductive organic paste 14B is a mixture of 85% by weight of gold powder of 1 micron and 15% by weight of polyamide acid, which is the precursor for polyimide, which is then cured at 400° C. The cured product is conductive. The temperature of 400° C. used for obtaining the low temperature-sintered gold 14A and the conductive organic paste 14B of the first and the second embodiments falls within the heat-resistant temperature range of polyimide to keep the polyimide insulating layer 13 from being carbonized and from being deteriorated.

The size of the via-hole in this embodiment is $50\mu \times 50\mu$, and the thickness of the insulating layer 13 is $30\mu$. Despite this difference, the difference in height between the first conductive layer 12 and the via-hole of the second conductive layer 15 is small because of the configuration where the low temperature-sintered gold 14A and the conductive organic paste 14B are embedded. This results in a secure connection between the first and second conductive layers 12 and 15.

The details of the production steps for the first and second embodiments of the invention are now explained.

Figure 4:
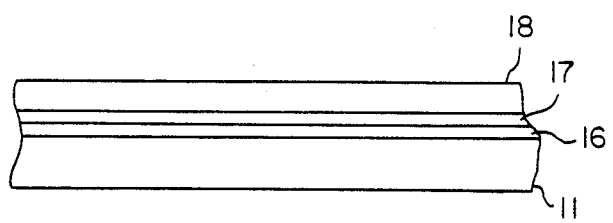
FIGS. 4 through 9 show the steps of manufacturing the first and second embodiments of the invention.

Referring to FIG. 4, chromium 16 in a thickness of 1000 Å is placed by sputtering on the substrate 11, and then palladium 17 in a thickness of 1000 Å is placed. Over the palladium layer 17 is spin-coated a liquid positive type photoresist 18 mainly consisting of ethyl cellosolve acetate, xylene and novolac rein.

Figure 5:
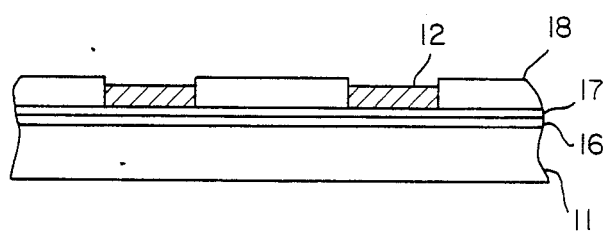

Referring to FIG. 5, the spin-coated photoresist 18 is exposed and developed by a predescribed chrome mask. The palladium layer 17 then functions as an electrode to plate gold to thereby form a pattern for the first conductive layer 12.

Figure 6:
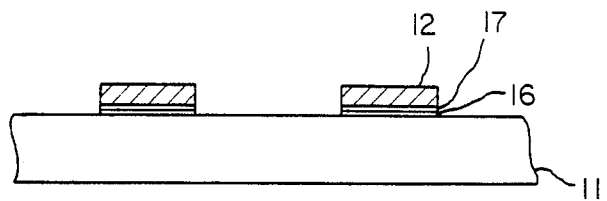

Referring to FIG. 6, the photoresist 18 is then peeled, and chromium 16 and palladium 17 are removed by etching from the portions other than the layer 12. The predetermined pattern is thus formed.

Figure 7:
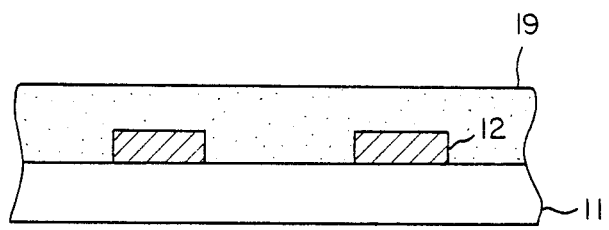

Referring to FIG. 7, the polyamide acid 19, which is the precursor of polyimide, is spin-coated in a thickness of $10\mu$. The polyimide precursor contains photo-sensitive resin.

Figure 8:
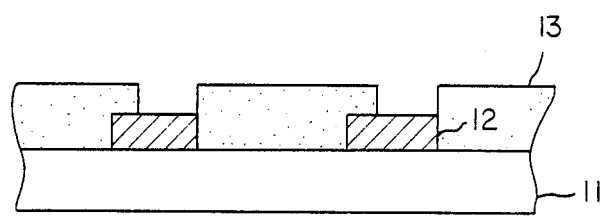

FIG. 8 shows the step of exposure and development using a predetermined via-hole mask which is necessary because of this photo-sensitive property, and the resultant via-hole in the size of $50\mu \times 50\mu$. Polyamide acid 19 is cured in $N_2$ atmosphere at 400° C., and a polyimide insulating layer 13 is formed.

Figure 9:
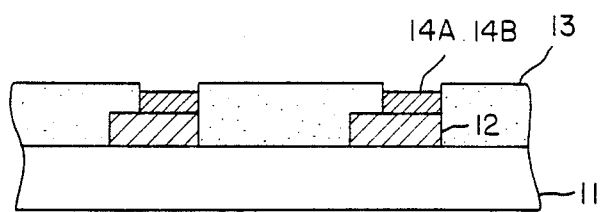

Referring to FIG. 9, a suitable amount of the low temperature-sintered gold 14A or the conductive organic paste 14B is placed on the insulating layer 13, and low temperature-sintered gold 14A or the paste 14B is embedded in the via-holes by a rubber squeeger. The gold 14A or the paste 14B remaining on the layer 13 must be completely removed. The gold 14A or the paste 14B in the via-holes is then sintered or cured at 400° C.

Turning back to FIGS. 2 and 3, the pattern on the second conductive layer 15 is formed by using the prescribed chrome mask and following the identical steps as for formation of the first conductive layer.

The present invention allows the secure connection between multi-layered conductive layers and improving the reliability thereof.

Many alternatives and modifications to the above embodiments can be made within the scope of the invention defined by the appended claims.

What is claimed is:

1. A high density multi-layered substrate comprising: an insulated substrate;
a first metallic conductive layer formed on the insulated substrate;
an organic insulated layer having via-holes of the shape of one of a cylinder and a reverse tape disposed over and exposing a portion of said first metallic conductive layer;
one of a low temperature sintered metal and an organic conductor embedded in said via holes; and
a second metallic layer formed on said organic insulated layer and one of the low temperature sintered metal and the organic conductor.

2. The substrate of claim 1 wherein said insulated layer comprises polyimide.

3. The substrate of claim 1 wherein said sintered metal is gold.

4. The substrate of claim 1 wherein said organic conductor comprises a mixture of gold powder and polyamide acid.

5. The substrate of claim 1 wherein the via-holes are substantially cylindrical.

6. A method for forming a multi-layered substrate, comprising the steps of:
depositing the first layer of metal on a substrate;
forming said metal layer into a first predetermined pattern;
coating the patterned metal layer with an organic insulator;
forming via-holes at predetermined locations in the organic insulator in the shape of one of a cylinder and a reverse taper to expose portions of the patterned metal layer;
embedding one of a powderedmetal and a conductive organic paste in said via holes;
depositing a second layer of metal on the organic insulator and the powdered metal;
patterning said second metal layer in accordance with a second predetermined pattern.

7. The method of claim 6 further including the step of heating said powdered metal after it is embedded in said via-holes.

8. The method of claim 6 wherein the step of forming via-holes at predetermined locations includes forming the via-holes to be substantially cylindrical in configuration.

* * * * *